(12) United States Patent
Kueny (10) Patent No.: US 10,861,755 B2
(45) Date of Patent: Dec. 8, 2020

(54) SYSTEM AND METHOD FOR MEASUREMENT OF COMPLEX STRUCTURES

(71) Applicant: Verity Instruments, Inc., Carrollton, TX (US)

(72) Inventor: Andrew Weeks Kueny, Carrollton, TX (US)

(73) Assignee: Verity Instruments, Inc., Carrollton, TX (US)

( * ) Notice: Subject to any disclaimer, the term of this patent is extended or adjusted under 35 U.S.C. 154(b) by 343 days.

(21) Appl. No.: 15/885,583

(22) Filed: Jan. 31, 2018

(65) Prior Publication Data

US 2018/0226305 A1 Aug. 9, 2018

Related U.S. Application Data

(60) Provisional application No. 62/456,348, filed on Feb. 8, 2017.

(51) Int. Cl.
| | |
|---|---|
| *H01L 21/66* | (2006.01) |
| *G01B 11/06* | (2006.01) |
| *G01N 21/84* | (2006.01) |
| *G06K 7/00* | (2006.01) |

(52) U.S. Cl.
CPC .......... *H01L 22/12* (2013.01); *G01B 11/0625* (2013.01); *G01B 11/0683* (2013.01); *G01N 21/8422* (2013.01); *G06K 7/0095* (2013.01); *G01B 2210/56* (2013.01)

(58) Field of Classification Search
CPC .. H01L 22/12; G01B 11/0625; G01B 11/0683
See application file for complete search history.

(56) References Cited

U.S. PATENT DOCUMENTS

| | | | |
|---|---|---|---|
| 6,388,756 B1 | 5/2002 | Ho et al. | |
| 7,049,156 B2 | 5/2006 | Kueny | |
| 2002/0160100 A1 | 10/2002 | Sarbacher et al. | |
| 2004/0032593 A1* | 2/2004 | Venugopal ......... | G01B 11/0625 356/504 |
| 2014/0297211 A1 | 10/2014 | Pandev et al. | |
| 2015/0176985 A1 | 6/2015 | Shchegrov et al. | |

FOREIGN PATENT DOCUMENTS

| | | |
|---|---|---|
| CN | 1675517 A | 9/2005 |
| CN | 1675518 A | 9/2005 |
| CN | 1771464 A | 5/2006 |
| CN | 104025275 A | 9/2014 |
| JP | 2009508167 A | 2/2009 |
| TW | 201307825 A | 2/2013 |
| WO | 2004015365 A1 | 2/2004 |
| WO | 2004015727 A2 | 2/2004 |

* cited by examiner

*Primary Examiner* — Errol V Fernandes (57) ABSTRACT

A system and method of use for simplifying the measurement of various properties of complex semiconductor structures is provided. The system and method supports reduction of structure complexity and modeling for optical monitoring and permits determination of film thicknesses and feature depths during semiconductor manufacturing processes.

20 Claims, 8 Drawing Sheets

SYSTEM AND METHOD FOR MEASUREMENT OF COMPLEX STRUCTURES

CROSS-REFERENCE TO RELATED APPLICATION

This application claims the benefit of U.S. Provisional Application Ser. No. 62/456,348, filed by Andrew Weeks Kueny on Feb. 8, 2017, entitled "SYSTEM AND METHOD FOR MEASUREMENT OF COMPLEX STRUCTURES," commonly assigned with this application and incorporated herein by reference.

TECHNICAL FIELD

The disclosure relates to optical measurement systems, and more particularly, to an optical measurement system and method that more readily measures properties of complex semiconductor structures. The system and method, along with a computer program product, can be used for monitoring film thicknesses, feature depths, and other properties of semiconductor structures during semiconductor processes.

BACKGROUND

Optical measurement systems are employed in a variety of industries, such as the semiconductor processing industry, for real-time monitoring of wafer modification and process control. Optical measurement systems may be integrated with a semiconductor processing tool and may be utilized in-situ for (near) real-time process control or in-line for run-to-run feedback control. Typically, monitored processes include semiconductor etching, deposition, implantation and chemical mechanical planarization processes.

Especially in the semiconductor processing industry, the use of increasingly variable material layers and features sizes (e.g., thinner/thicker layers, high aspect ratio features, very small features, mixed size features, highly variable reflectivity/absorption materials, and high layer count stacks) has led to difficulties in achieving necessary levels of measurement accuracy and precision of semiconductor structures. In addition to the increasing complexity of the semiconductor structures themselves, highly integrated single chamber multiple step processes and dynamic tool changes of processing mechanical parameters (e.g., aperture and working distances) cause variation in optical signal levels adversely affecting measurement accuracy and precision.

Semiconductor processing techniques used for the fabrication of integrated circuits and microelectromechanical systems (MEMS) employ multiple processes aimed at creating or removing a material layer, and/or creating or selectively removing parts of layers to create topography on these layers. A typical requirement of these processes is often a constraint for a precisely controlled dimension such as the thickness of a film layer or the depth of an etched hole or linear feature "trench". An example of leading semiconductor technology with these constraints is the etching of features such as vertical channel holes in three dimensional (3D) NAND structures. In this process, a silicon wafer has had deposited on it a complex stack comprising multiple thin layers. At certain times, the stack may also be covered by a top layer mask, typically photoresist, which has openings in it to permit etching of channel holes. During the etch process, the pattern of openings in the mask will typically be transferred to the underlying complex stack by anisotropic dry etching techniques. During this step, the mask itself may also be etched and thinned. It is often desirable to control the final depth, to nanometer precision, of the channel holes or other features to avoid etching into the underlying substrate and/or over-etching the channel holes resulting in over-sized diameters. Because the channel holes are etched through the mask and the underlying layers, determining the depth of the holes may require knowledge of both the total channel hole depth, the thicknesses of all layers in the stack, the thickness of the mask and other parameters.

For the 3D NAND and other structures, it is desirable to have measurement systems and techniques of operation that allow the hole depths and layer thicknesses to be measured continuously, in-situ, on each wafer, during the etching process or other manufacturing process. In-situ measurement of channel hole depths and mask layer thicknesses would reduce the need for off-line metrology steps, eliminate the production of out-of-spec product, and allow larger tolerances to be used for control of the process. Making the measurement in-situ, however, is more difficult than making it at a dedicated metrology station. Methods which require contact with the wafer, or are destructive, cannot be considered, so optical methods are preferred. Optical methods in the prior art which are compatible with in-situ real time measurement exist, but generally lack the sophistication to measure quantities on complex patterned device wafers of current interest.

Prior art optical methods may be divided into two major classes of technique. Within the field of semiconductor processing, these techniques are commonly named optical emission spectroscopy ("OES") and inteferometric endpoint ("IEP"). Simply defined, OES is related to the characterization of emissions from light-emitting chemical species and IEP is related to the characterization of optical properties of semiconductor structures undergoing processing.

For the processing of complex structures, the prior art OES methods may be considerably limited in applicability since they are known to average optical signal changes over all portions of a semiconductor device being processed and lose specificity to changes in desired parameters spatially over the wafer which can result in misprocessing. IEP methods are generally more spatially selective but weaknesses still remain in their application to complex structures.

The prior art IEP methods are generally limited in their usefulness for continuous in-situ monitoring due to several factors previously unaddressed in the prior art. One shortcoming is that the prior art methods require an accurate measurement of the reflectivity of the semiconductor structures on a wafer over a broad range of wavelengths. The reflectivity is the ratio of the incident to reflected optical power from the wafer. In an in-situ measurement, neither the beam incident on nor reflected from the wafer is directly accessible to measurement. Hence, the reflectivity of the structure has to be inferred from a measurement which is a function of the reflectivity and some other system properties, such as the transmission of a window and the reflectivity of known reference targets. If these properties are unknown, or if they are subject to change, then the inference requires the addition of further parameters.

SUMMARY

In one aspect, the disclosure provides a method of generating a reduced complexity model of a complex semiconductor structure for monitoring of the semiconductor structure during a semiconductor manufacturing process. In one embodiment the method of generating includes: (1) receiving information about the semiconductor structure, (2) determining, as a function of at least one variable processing parameter, a simplified optical model of both a modified portion and an unmodified portion of the semiconductor structure employing effective medium approximation and the received information, and (3) combining the simplified optical models of the unmodified portion and the modified portion to provide a simplified model for the semiconductor structure, wherein the simplified model is sufficient for providing controls for the semiconductor manufacturing process.

In another aspect the disclosure provides a controller for directing a semiconductor process of a complex semiconductor structure. In one embodiment the controller includes: (1) an interface configured to receive information corresponding to a semiconductor process and a semiconductor structure, and (2) a processor configured to generate a simplified optical model of the semiconductor structure employing the information and effective medium approximations, and generate processing control signals to direct the semiconductor process based on the simplified optical model and optical processing data obtained from observing the semiconductor structure during the semiconductor process.

In yet another aspect, the disclosure provides a method of generating a simplified model of a complex semiconductor structure for monitoring of the complex semiconductor structure during a semiconductor manufacturing process. In one embodiment, the method of generating a simplified model includes: (1) receiving information about a complex semiconductor structure; constructing a simplified model of the complex semiconductor structure employing the information and effective medium approximation, and (2) iteratively determining the simplified model is sufficient to provide meaningful results for monitoring a parameter of interest during the semiconductor manufacturing process.

BRIEF DESCRIPTION OF THE SEVERAL VIEWS OF THE DRAWINGS

The novel features believed characteristic of this disclosure are presented herein. The disclosure itself, however, as well as a mode of use, further objectives and advantages thereof, will be best understood by reference to the following detailed description of an illustrative embodiment when read in conjunction with the accompanying drawings wherein.

DETAILED DESCRIPTION

In the following description, reference is made to the accompanying drawings that form a part hereof, and in which is shown by way of illustration, specific embodiments in which the invention may be practiced. These embodiments are described in sufficient detail to enable those skilled in the art to practice the invention, and it is to be understood that other embodiments may be utilized. It is also to be understood that structural, procedural and system changes may be made without departing from the spirit and scope of the invention. The following description is, therefore, not to be taken in a limiting sense. For clarity of exposition, like features shown in the accompanying drawings are indicated with like reference numerals and similar features as shown in alternate embodiments in the drawings are indicated with similar reference numerals. Other features of the invention will be apparent from the accompanying drawings and from the following detailed description. It is noted that, for purposes of illustrative clarity, certain elements in the drawings may not be drawn to scale.

In addition to the above noted deficiencies, conventional systems used to measure properties of complex semiconductor structures during various processes fail to fully address minimization. The minimization problem which should be solved in order to make a measurement entails a search over a parameter space whose dimension is higher than the number of unknowns being determined. At a minimum, one fitted parameter is needed for each of the quantities being determined. Because these methods depend on finding an accurate fit between the observed and calculated reflectivity, spanning parameters, such as parameters for describing: scattering from the sides of trenches; the coherence of the light in the optical system; heuristic "size coupling factors;" dissipation factors; and polarization factors, may be added to models and included in the minimization process. Each additional fitting parameter raises the level of difficulty of the problem. The minimization problem is further worsened by spatial variation of the observed semiconductor structures (areal density and different structures in different areas of the wafer) and the general inability of in situ systems to exactly probe a known wafer location/structure consistently.

The additional reliance of conventional systems on the requirement of a substantially accurate fit model imposes the limitation that a model be specific to a narrow range of structures for which it is suitable. This, however, is inconvenient to use in a production environment where structures of many different kinds are processed, since different forms of the model have to be used with different structures. Furthermore, the processes need to be controlled with near real time precision (a few milliseconds). Even with powerful computing resources, obtaining this performance on complex models with tens or even hundreds of parameters is effectively impossible at commercially viable costs.

Disclosed herein is a modelling scheme for complex semiconductor structures (complex structures) and a measurement/monitoring method and system that employs the modelling scheme, and/or simplified optical models generated thereby, to monitor the complex structures during semiconductor processing. The complex structures can be, for example, 3D NAND structures, and the semiconductor processing can be, for example, etching. The simplified optical model or models that are generated are mathematical models of reflectance of a complex structure at one or more states during processing that provide a simplified reflectance model, such as an optical reflectometry model, of the structure including parameterization of desired measureable quantities. The system can include a controller that compares the simplified optical model or models with the measurements obtained during processing to determine the values of measureable parameters and direct the processing operation in real time. In one embodiment, the controller relates real time measurement data to at least one simplified reflectance model to approximate boundaries between layers of the complex structure and derive control parameters, such as a thickness or depth, therefrom.

The disclosure recognizes that if the generated simplified optical model or models is not specific or sensitive enough to a parameter of interest, then the results from comparing real time data to the models are not useful. As such, the disclosure provides simplified optical models, referred to hereafter as simplified models, that are sufficiently generalized with a reduced number of parameters but still can be used to output suitable controls for the processes. The simplified models, therefore, are constructed with a minimum amount of information, referred to herein as minimum information, that sufficiently represents complex structures and provides meaningful outputs for controlling a semiconductor manufacturing process when real time data from the manufacturing process is compared to the simplified model. Information about a complex structure includes the attributes, features, and details of the complex structure. In determining the minimum information, the disclosure advantageously recognizes what information of a complex structure to ignore when constructing a simplified model and what information is needed to construct a usable simplified model of a complex structure. In some embodiments, determining what minimum information is needed is an iterative process that includes comparing real time optical processing data (such as optical information or measurements) to a constructed simplified model and determining if the comparison provides meaningful results for monitoring or controlling manufacturing processes. If so, the minimum information used to construct the simplified model is sufficient. If the comparison provides results that are not meaningful, then additional information is needed to construct a simplified model. Reciprocally, if the minimum information is found to be sufficient then information may actually be removed from the simplified model to further reduce its complexity and increase its general applicability. Thus, when constructing or generating simplified models, the disclosure recognizes obscuring or removing parameters that do not affect comparison results and desirable measureable parameter values that are useful for controlling processes. As such, generating simplified models can include iteratively determining that a simplified model is sufficient to provide meaningful results for monitoring a parameter of interest during a manufacturing process.

In various examples, the simplified models that are constructed for the complex structures are specific to a parameter that is trying to be determined. Multiple simplified models can be constructed to form a set of models over a range of interest for different parameter values. For example, a set of simplified models can be constructed for monitoring the thickness of a layer wherein each of the different models of the set of simplified models has a value within a range of interest. The parameter values can be incremented over the range in the various models of the set of simplified models and real time data from a manufacturing process can be compared to each of the different simplified models during the process to determine which model comports with the real time data. Parameter values, such as a thickness of a layer can then be determined from the simplified model best matched from the set. The set of simplified models can be stored in a look-up table and retrieved for comparison. The model or sets of simplified models used during a manufacturing process can vary throughout the process depending on a particular parameter being monitored at a certain time during the process. The simplified models can be constructed before the actual collection of real time data during manufacturing processes to confirm the models are sufficient. This can be done with one or more sets of preliminary real time data or via simulation and a set of information to build the simplified models. A process of constructing, testing to determine if additional information is needed or may be removed for constructing a sufficient simplified model, obtaining additional information if needed, and repeating can be used to construct and vet the simplified models before being used during the manufacturing processes.

Figure 1A:
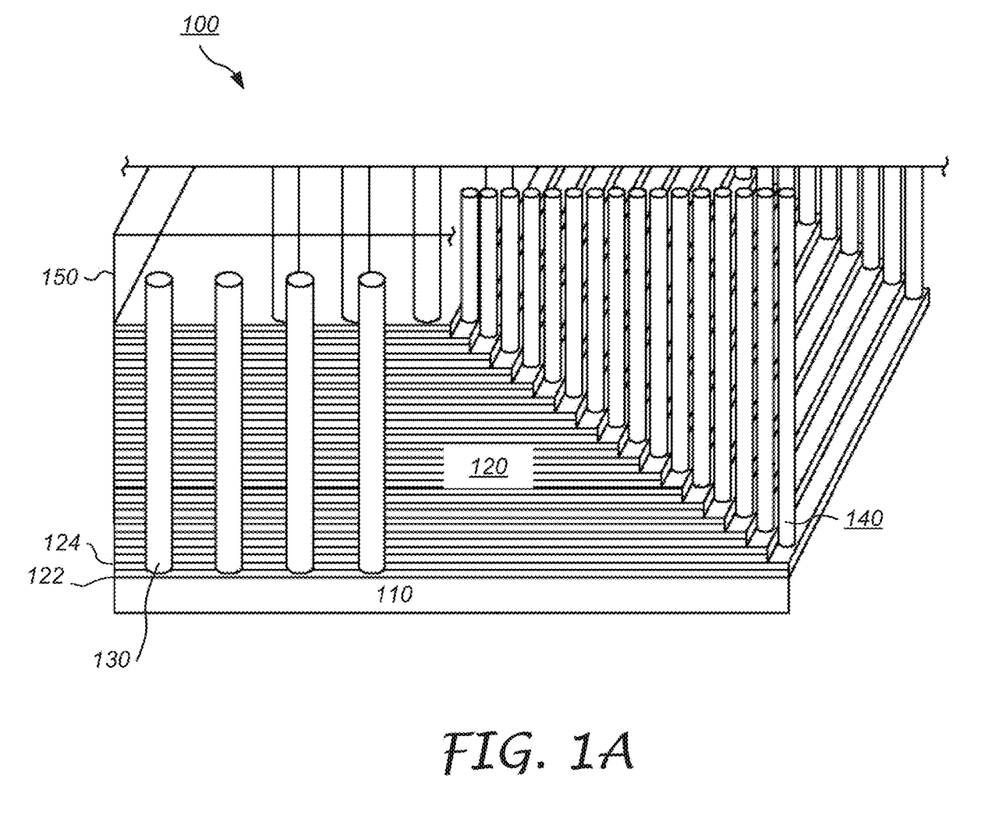
FIG. 1A shows a 3D representation of a portion of a complex 3D NAND structure.

FIG. 1A shows a 3D representation of a portion of a complex 3D NAND structure 100 that is useful for explaining features of the disclosure. Memory devices based upon 3D NAND semiconductor structures such as shown in FIG. 1A are important drivers in the evolution of mobile devices and other electronic systems requiring large amounts of data storage. To enable high density storage, the complexity of the memory structures have advanced into a combination of Angstrom- and nanometer-sized features and layers patterned into micron-size topological structures. The following discussion describes the application of the principles of the disclosure to channel hole etching but it should be understood that the methods and systems of the disclosure may be applied to other process steps of 3D NAND semiconductor fabrication as well as other semiconductor manufacturing processes in general.

To create 3D NAND structures as shown in FIG. 1A, substrate 110, typically silicon, is treated to a number of process steps which result in the creation of a terraced ("staircase") collection of layers 120. Layers 120 are commonly paired layers of semiconductor materials such as silicon dioxide and silicon nitride. One each of the silicon dioxide and the silicon nitride layers are identified in FIG. 1A as silicon dioxide layer 122 and silicon nitride layer 124, respectively. The silicon dioxide and silicon nitride layers of the layers 120 can be in total pair counts such as 32, 64 and 128 layers. Each of the individual layers of the layers 120 of semiconductor material may be a few tens of nanometers or so in thickness, such as 30 nanometers. Additional layers (not shown) such as etch-stop layers between the substrate 110 and the layers 120 may be included in the 3D NAND structure 100. These additional layers may be formed from silicon nitride and titanium nitride.

In-situ etch process monitoring systems often utilize a large spot optical interrogation system to reduce pattern sensitivity. In this context "large spot" implies that the diameter of the optical spot observed on the wafer is much larger than the average size of any individual interrogated semiconductor structure. This results in complicated reflectance spectra from the interrogated structures and lack of sensitivity to specific regions, features and/or structures. Also during processing, portions of a structure may change, a modified portion, and other portions may not change, an unmodified portion. In the case of the 3D NAND channel hole processes described herein, channel holes 130 may be etched through mask layer 150 while staircase contacts 140 remain un-etched. The temporal dynamics of the reflectance signal from the changing and fixed portions, or modified and unmodified portions, of the 3D NAND structure 100 produce a complex function that is not easily modeled, fit and/or otherwise processed to provide measurement quantities. For example, un-etched large scale features may give rise to dominant static reflectance signatures and etched small scale features may give rise to less dominant reflectance signatures.

Small features such the channel holes 130 may be 40 to 50 nm in diameter with a 80 to 100 nanometer pitch spacing and have high aspect ratios typically greater than 60:1. Due to the small diameter of the channel holes 130, free propagation of light is inhibited and direct interferometric methods cannot probe the depth of the hole during the etching process. Other aspects that hinder both interferometric and reflectometric methods of interrogation include lack of information concerning layer thickness, material characteristics (optical dielectric constants including real and imaginary constants), layer counts, exact hole sizes, hole shapes (e.g., circular, elliptical) much of which information is either proprietary or difficult to know precisely during active semiconductor fabrication.

Reduction of the known and unknown complexity to permit modeling and extraction of processing parameters, such as control trend, reflectance signatures, thicknesses, depths, etc., that permit control of the etch process is highly desired. Recognition that certain characteristics of semiconductor structures may be simplified in various ways leads to the overall simplification of the modeling and parameter extraction. In the case of the channel hole 130, the diameter is less than $\lambda/10$ for most visible and NIR wavelengths and the individual layer thicknesses are each also under $\lambda/10$ for those same wavelengths. It is recognized that these length parameters permit application of effective medium theory, also known as effective medium approximations, under appropriate assumptions and model construction to support identification of the processing parameters such as trend, reflectance signatures, thicknesses, depths, etc., that permit control of the etch process. As applied to the channel hole case, the effective medium approximation is applied at least twice. Firstly, to approximate the stack of thin alternating layers 120 as a homogeneous material and secondly, to model the portion of the stack of layers 120 into which the holes have penetrated as a second homogeneous material of lower density. The mask layer 150 can similarly be modeled as the layer 120. Additionally, the effective medium approximation may be similarly applied to the mask layer both during the mask open step where one has both un-etched homogeneous mask material and etched mask material approximated as a simplified material with holes, as well as during the etching of the actual channel holes 130. The application of the mathematical simplifications, using optical theory for simplifying reflectance calculations, described herein to the optical modelling of the various layers and features reduces the dimensionality of the modeling 3D NAND structures from 50 to 100 parameters by approximately an order of magnitude to a much more trackable dimensionality of 3 or 4.

Figure 1B:
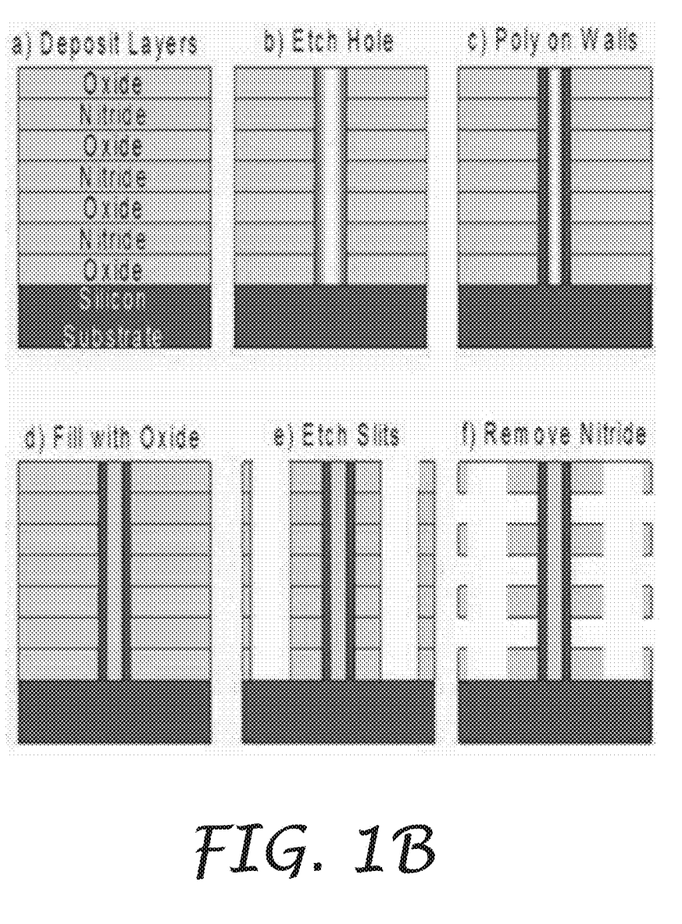
FIG. 1B shows a series of 2D representations of various steps used during fabrication of a complex 3D NAND structure.

FIG. 1B shows a series of 2D representations of various steps used during fabrication of a complex 3D NAND structure, such as the 3D NAND structure 100 of FIG. 1A. The techniques of the disclosure may be applied to multiple of the indicated steps as follows. During deposition step (a), any previously deposited layers may be modeled as a homogeneous material to permit interpretation of the reflectance signal change upon the deposition of the topmost layer. This modeling reduces the structure complexity from N-layers to a much simpler two-layer form. During channel hole etch step (b), the etching of the layers may be modeled as described herein. During polysilicon and oxide deposition steps (c) and (d), respectively, the filling or partial filling of the holes may be modeled as an increase in the effective optical density of the material similar to how the channel hole etch step (b) reduces the optical density. During slit and nitride etch steps (e) and (f) respectively, the material removal may be modeled as a decrease in the effective optical density of the material. The slit etch step (e) may pose an additional difficulty and require adjustment of the application of the simplified model to include the effect of light polarization. The aspect ratio of the slits is often such that in one lateral dimension it is much smaller than the wavelength but much greater in the other lateral dimension and this configuration leads to polarization dependencies in observed reflectance spectra. Similar to the etching for channel holes, such as the channel holes 130, the etching for "staircase" contacts 140 may utilize the techniques of the disclosure.

Figure 2:
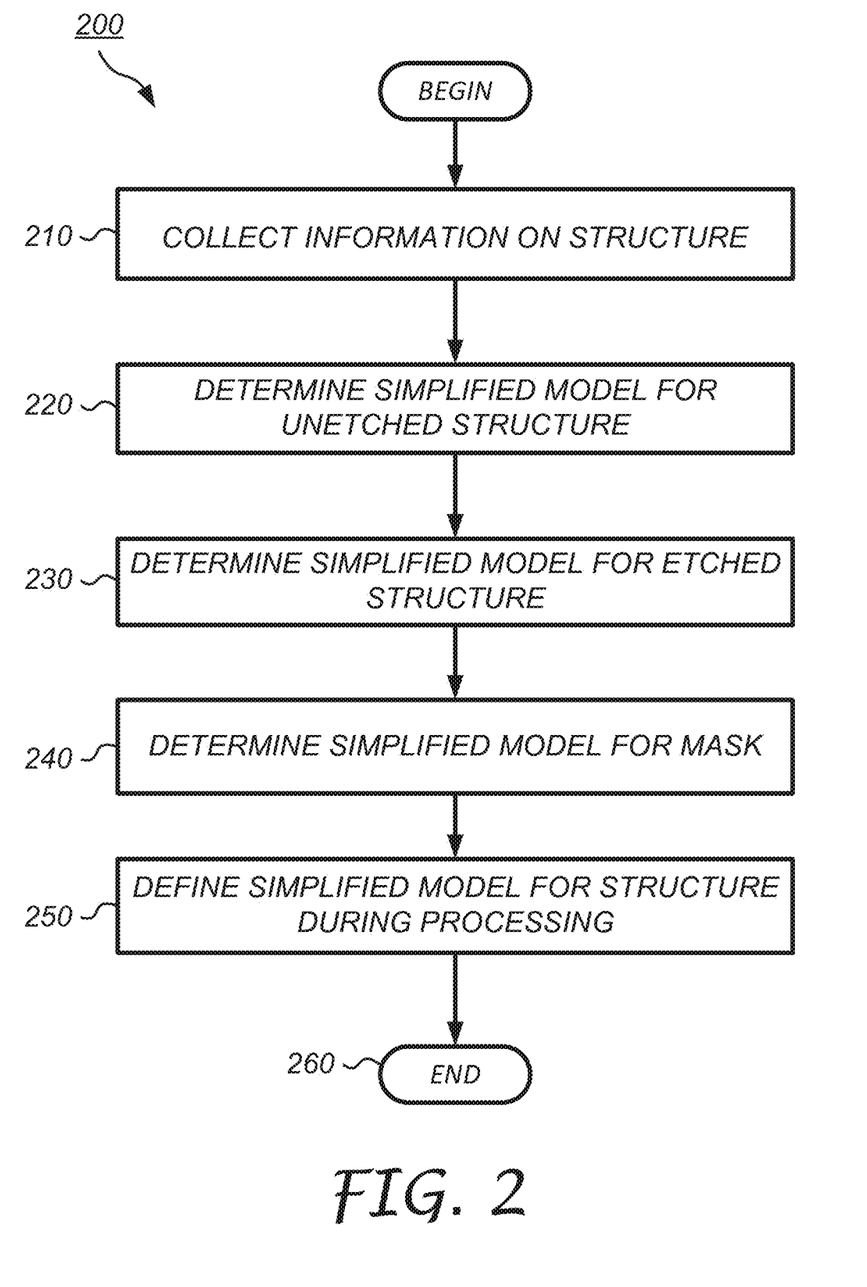
FIG. 2 shows a flowchart representing a method for reducing the complexity of a semiconductor structure permitting improved real-time monitoring, in accordance with an embodiment of the disclosure.

FIG. 2 shows a flowchart representing process 200 for reducing the complexity of a reflectance model of a semiconductor structure permitting improved real-time monitoring, in accordance with an embodiment of the disclosure. The process 200, begins with step 210 wherein information is collected regarding the structure to be monitored. The information can be provided by and received from a client or customer who is fabricating or designing the complex structure. The information may include, but is not limited to, film thicknesses, film types and optical characteristics of materials, film/feature dimensions/pitches, shapes and orientation, and other attributes or details. Once the information has been collected, during step 220 at least one simplified model of the unmodified portion(s), un-etched portion(s) in this embodiment, of the structure(s) to be monitored may be determined. Outputs from any simplified model should permit differentiation and identification of critical parameters such as film thickness or hole depth over the range of interest. With these assumptions, a simplified optical model may be defined and evaluated/simulated to determine if meaningful change is observed in the optical signature of the reflectance permitting extraction/identification of measurement parameters e.g., interference fringes change as the channel holes are etched and associated with the depths of the holes.

In one embodiment, the information is minimum information. An example of the required minimum information for constructing a simplified model of the layer 120 of the 3D NAND structure 100 in FIG. 1 includes the optical properties of the materials that make-up the layer 120, an approximate ratio of the thicknesses of each type of the materials in the layer 120, the thickness of the layer 120, and the relative area of the holes 130 to the layer 120. This information can be obtained from multiple sources, including the client, the chip designer, and the owner of the intellectual property associated with the chip. In the simplified model of a semiconductor structure defined using effective medium theory, a structure made up from two components having indices n1 and n2, may be represented as a homogeneous structure with index $n_{eff}$, where $n_{eff}$ is calculated from n1, n2 and the volume fraction. In the case of the channel hole etch, the two components are silicon dioxide and silicon nitride which may be approximated to each have 50% volume fraction (or other value based upon known structure information). The form of the expression for $n_{eff}$ takes different forms depending on the geometric classes of the structure (embedded spheres or holes, lamellae, etc.) and the polarization of the radiation. In general, the geometric classes may be supplied as part of step 210. In the case of the channel hole etch, there are two different geometric classes: lamellae for the layers and embedded cylinders for the etched channel holes. Expressions for the upper and lower bounds on $n_{eff}$ may be defined that are independent of the details of the structure for instance specific hole placement and individual layer thicknesses. For the purposes of the disclosure, each time the effective medium approximation is applied to a structure it may be necessary to introduce a parameter, ranging from 0-1 (or other applicable range), supporting spanning $n_{eff}$ from the lower to the upper bound. The spanning parameter may be used to address variation in geometric class, volume fraction, material properties and/or other variables not entirely derived from the required information collected in step 210. As such, spanning parameters can be used to compensate for parameters, such a physical parameters, that have unknown values. The spanning parameters can have a range of values with boundaries based on, for example, the information, historical data, or test data. Once the value of a spanning parameter is known, then it can be fixed. For example, the values can be derived during initial measurements within the semiconductor process and then fixed once known.

In one embodiment, a spanning parameter can be used for a volume fraction of layers that is unknown but is identified during the processing and then fixed for further modelling or process monitoring. Specific to this example, the volume fraction may be predetermined as 50% but due to inherent process variation may range from 45% to 55% and a spanning parameter may be defined to provide accommodation for this variation. Multiple different types of spanning parameters can be employed at different times during the modelling and monitoring. A further example of a spanning parameter may be defined for the geometry of the etched holes. Although ideally the etched holes are cylindrical with circular cross-section; it is known that etching can produce holes that are elliptical in cross-section. In this case, a spanning parameter may be defined with respect to the hole eccentricity which ranges from zero for a true circular cross-section to a value of one for highly elliptical cross-section holes. Additional examples of a spanning parameter may include parameterization of the "step angle" in the layers of the example 3D NAND stack and the compensation for changes in the spatial density of etched holes.

Next and similarly in step 230 at least one simplified model may be determined for any modified portion, an etched portion in this embodiment, of the structure. This model for the etched portions may be derived from a combination of the model output from step 220 in association with one or more additional materials either added or subtracted therefrom. To model the etched portion, one may assume, for example, that the volume fraction of the holes is 10% and variation therein accommodated by a spanning parameter. Specifically, a simplified model of etched portion may be constructed from a predetermined (in step 220) simplified model of the unetched portion which is subsequently combined with the geometric and material details of the etching of the channel holes. In general, since etch selectivities are not ideal, the mask layer overlying the materials to be patterned may change (or for mask open processing). A simplified model of the etched and/or unetched mask may be determined during step 240. Once all portions of the structure and/or mask have determined models, a combined model for the structure may be defined in step 250 by combining the etched, un-etched, and mask simplified models. In a final step 260 of process 200, any outputs of any of the preceding steps may be, for example, stored for future use. A simplified model may be applied in place of individual layer structures as represented in U.S. Pat. No. 7,049,156, which is incorporated herein by reference in its entirety, and wherein a multiwavelength reflectometric framework useful for the application of the simplified model is disclosed.

In some embodiments, a simplified model useful for real-time processing includes parameterization of the etched and unetched portions of the structure and extraction of parameter values as the etch advances and the structure is changed. Although exemplified to the etching of holes in 3D NAND structures it should be understood that this is not limiting and that the techniques described herein may be applied to other semiconductor structures.

Figure 3A:
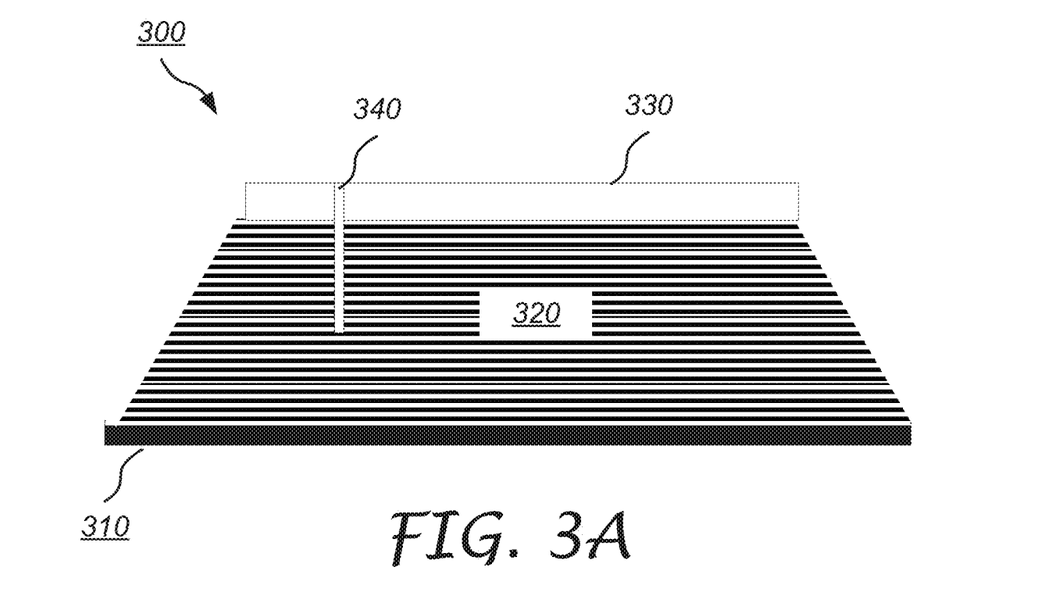
FIGS. 3A and 3B show, respectively, a cross-section of the 3D NAND structure of FIG. 1A and a simplified model of the same structure, in accordance with an embodiment of the disclosure.
Figure 3B:
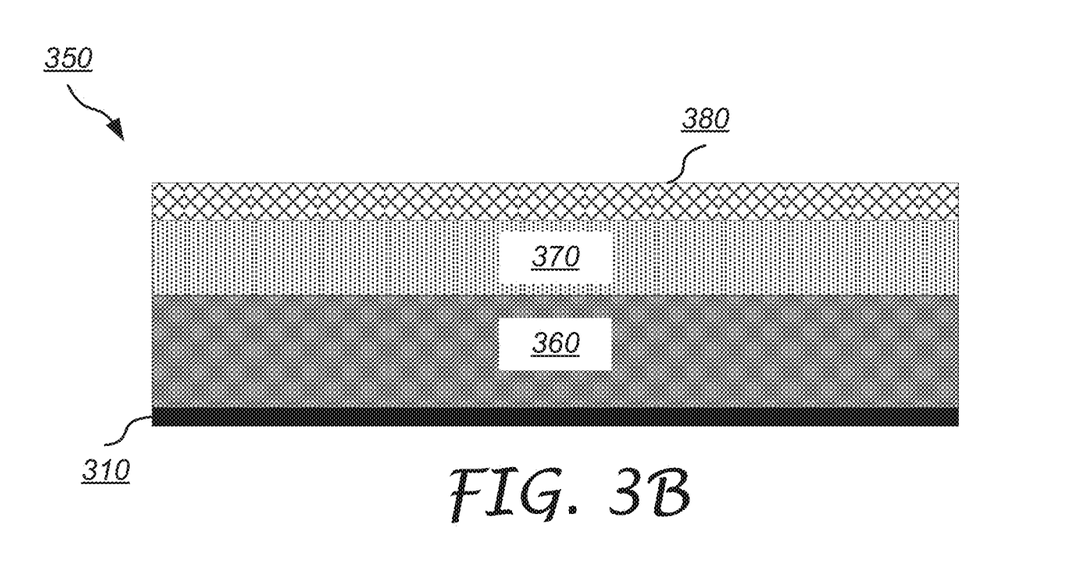

FIGS. 3A and 3B illustrate models of the 3D NAND structure 100 of FIG. 1A. FIG. 3A shows a cross-section 300 of the 3D NAND structure of FIG. 1A and FIG. 3B illustrates a simplified model 350 of the same structure, in accordance with an embodiment of the disclosure. The simplified model 350 provides a visual representation of the simplified reflectance model that is generated according to the principles of this disclosure. Cross-section 300 re-iterates the details of FIG. 1A here for ease of comparison with the simplified model 350. Within cross-section 300, silicon wafer substrate 310 supports deposited film layers 320, typically of silicon dioxide and silicon nitride and may be overlain by mask layer 330. Although a multitude of holes will be etched into layers 320, a single channel hole 340 is indicated for brevity. Simplified model 350 does not consider the staircase features since they are static during the channel hole etch process and the inclusion of such structural details may add unnecessary complexity and parameters to the model. Within the model evaluation processes discussed above, the staircase features were determined to be unnecessary information for the current 3D NAND structure simplified model. If further evaluation of simplified model 350 is deemed limited by the exclusion of the "staircase" features, these may be included within a revised model using an appropriately defined spanning parameter. Thus, different models or sets of models can be used during a manufacturing process with the adjustment or inclusion of a limited set of additional parameters. Within simplified model 350, silicon wafer substrate 310 is identical to that of cross-section 300. Deposited film layers 320 are replaced by a bilayer of effective medium layers 360 and 370 being without holes and with etched holes, respectively. Although, this detail of the simplified model assumes that all holes are etched at the same rate to the same depth at any point in time; model fitting may resolve an interface (depth of etch) that approximates an average of the etched depth. This simplification of a multitude of hole depths into a single value of the average hole depth removes unnecessary complexity for the simplified model and is supported by the practical aspect that the etching csnnot control the depths of the individual holes. Mask layer 380 is shown here as a single homogeneous layer (simplified model combination of solid mask material with added holes) post the mask open step. Alternatively, if the mask has not been fully etched then the mask layer would be represented as a bilayer and the deposited film layers 320 as a single layer. Thus, the simplified model 350 visually represents a simplified reflectance mathematical model that includes multiple layers constructed from effective medium approximations and other simplifications, the bilayer of effective medium layers 360 and 370, and an additional mask layer 380. The simplified model 350 can be generated based on the information obtained from a customer about the complex structure and then used with the optical data collected during processing of the complex structure to control the manufacturing process. This simplified model includes only three variable processing parameters: mask thickness (layer 380), etch hole depth (layer 370 thickness), and unetched thickness (layer 360 thickness) in place of a complex model that may include tens to hundred parameters. The effective medium layers 360 and 370 advantageously do not take into account the number of layers within since this is not a parameter of interest for control and is therefore not being tracked with the simplified model 350. This concept reduces complexity and improves flexibility by allowing the simplified model 350 to be used, in the case of the exemplary 3D NAND structure, with other structures with more/less layer counts, variable hole geometries and differing staircase features. In one example, another structure could be a modified version of the 3D NAND structure 100 that includes a more layers within layer 120.

Figure 4:
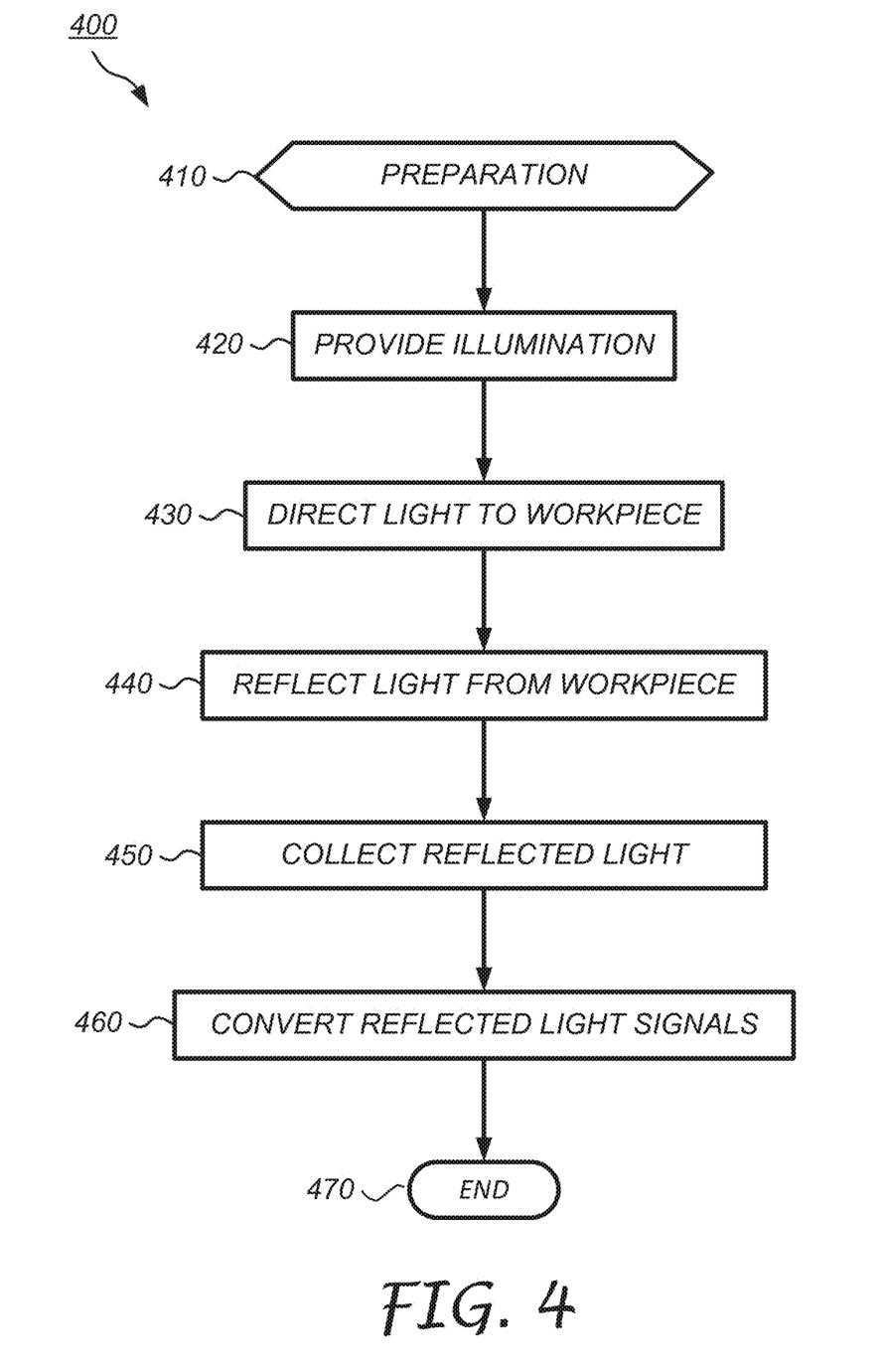
FIG. 4 shows a flowchart representing a method for collecting optical processing data from a complex semiconductor structure, in accordance with an embodiment of the disclosure.

FIG. 4 shows flowchart representing process 400 for collecting optical processing data from a complex semiconductor structure, in accordance with an embodiment of the disclosure. For the exemplary channel hole etch, process 400 provides optical interrogation of the structure undergoing etching. Process 400 starts with preparation step 410 wherein any necessary initialization may be performed. This may include sub-steps such as defined in FIG. 2 and/or determination of appropriate optomechanical systems and components. In step 420, illumination is provided for interrogation of the structure. The illumination may be for example from a flashlamp such as the FL2100 provided by Verity Instruments, Inc. of Carrollton, Tex. In step 430, illumination may be directed to the structure via optical fibers and optical elements such as windows, lenses, collimators, and polarizing elements. Light may then be reflected from the structure to provide optical interferometric and/or reflectometric signals in step 440. Next, in step 450, reflected light may be collected via optical elements and optical fibers and directed to a light measuring instrument such as a spectrometer e.g., the SD1024G from Verity Instruments, Inc. of Carrollton, Tex. A light measuring instrument may then convert the light signals into electrical and digital representations available for further processing during step 460. The processed digital signals can then be compared to a simplified model or set of simplified models for monitoring of the manufacturing process, which is channel hole etching in this embodiment. The method 400 then ends in a step 470.

Figure 5:
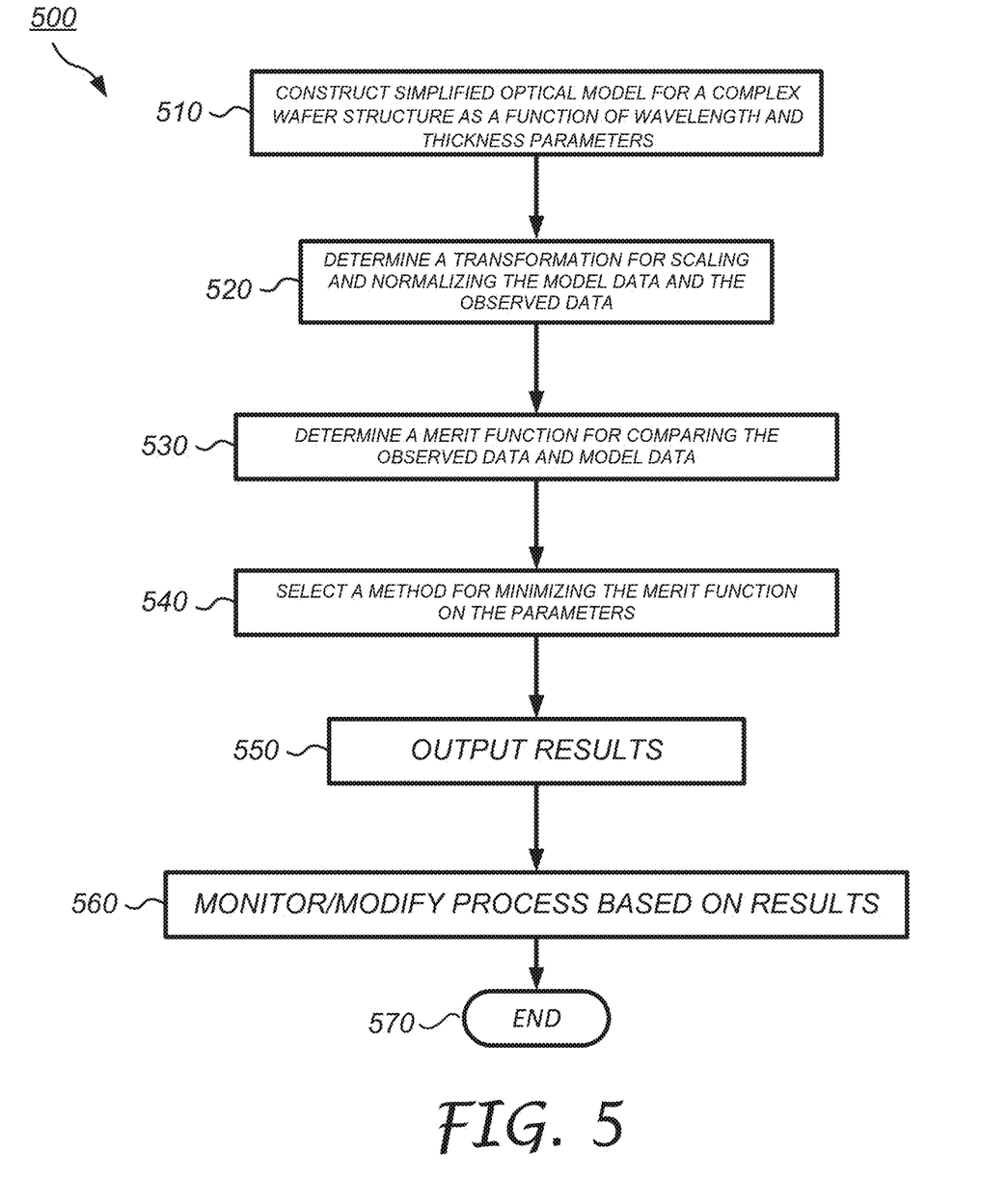
FIG. 5 shows a flowchart representing a method for processing collected optical processing data from a complex semiconductor structure, in accordance with an embodiment of the disclosure.

FIG. 5 shows a flowchart representing process 500 for processing collected optical data from a complex semiconductor structure, in accordance with an embodiment of the present disclosure. Step 510 of process 500 may be used to construct a simplified optical model as a function of wavelength, thickness, and other structure or material parameters such as described herein in association with process 200 of FIG. 2. Next in step 520, transformations may be applied to scale and/or normalize the observed and/or optical model data to remove, for example static, optical signatures from un-etched features or normalize reflectance to a known reference. Next, in step 530, a merit function may be selected for comparing the observed and optical model data and then, in step 540, the merit function may be minimized. Minimization may include the calculation of a set of merit function values between observed real time data and a multitude of simplified optical models each parameterized using one or more desired measureable quantities. The determination of a minimum value of the merit function from the set of merit function values may then be associated with any parameterized measureable quantities. Following minimization, in step 550, results, including but not limited to, determined depths and/or thickness may be output to a controller for modifying the monitored process in step 560 and/or stored for future use. Although process 500 considers applying a multiwavelength reflectometric method to the observed and optical model data, it should be understood that application of the present disclosure may include simpler single wavelength interferometric trend analyses. A representative merit function in this case may be, for example, the calculation of a set of Chi-square parameters between observed reflectometric data and the one or more simplified optical models.

Figure 6A:
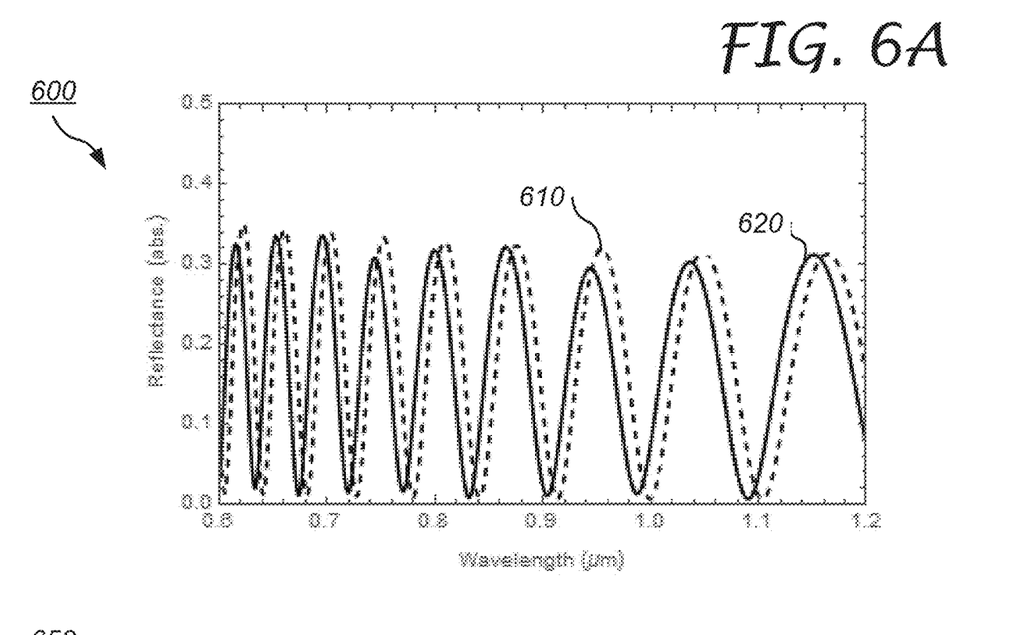
FIGS. 6A and 6B show plots of simulated data representing the evolution of multiwavelength and single wavelength trend IEP data useful for monitoring the progress of etching channel holes into the 3D NAND structure of FIG. 1A, in accordance with an embodiment of the present disclosure.
Figure 6B:
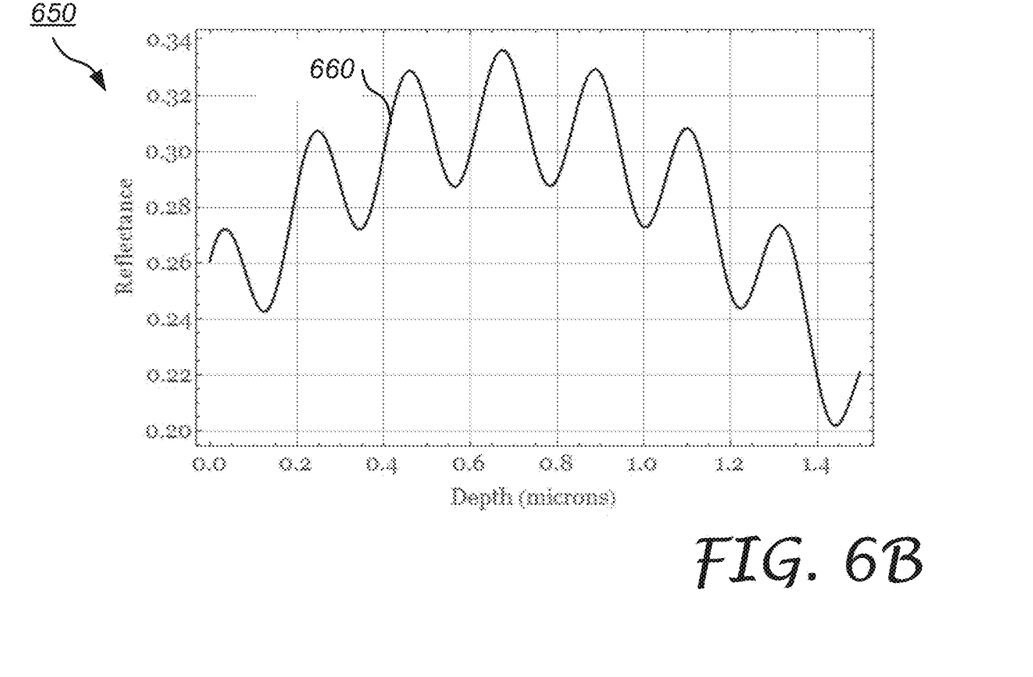

FIGS. 6A and 6B show plots 600 and 650, respectively, of simulated data representing the evolution of multiwavelength reflectometric and single wavelength trend data useful for monitoring the progress of etching holes into the 3D NAND structure of FIG. 1A, in accordance with an embodiment of the disclosure. Plot 600 includes two reflectometric curves 610 and 620 indicating the optical reflectivity change of a stack of equal fraction silicon dioxide and silicon nitride layers a total of 3 microns thick un-etched (curve 610) and etched 1.5 microns deep (curve 620). By comparison we can observe that the mostly static large scale fringe structure from the layer stack is "shifted" in wavelength by the addition of the etched channel holes. This shift may be tracked and changes such as observed in curves 610 and 620 may be processed according to process 500 of FIG. 5 to provide useful process control parameters such as the depth of the etch at any specific time during processing. Curves 610 and 620 are shown at specific etched hole depths but it should be understood that these curves are only specific instances of a continuum of curves that evolve as the etch advances from an unetched state to a fully etched state.

FIG. 6A represents two submodels, that correspond to the curves 610 and 620, of a set of simplified models with each of the submodels corresponding to a specific thickness of a layer. The amplitudes of the curves 610 and 620 provide limited benefit for tracking. However, tracking the shift between the curves 610 and 620 is valuable to be able to track the depth of a hole. As real data is compared to, via for example computation of a merit function, the curves 610 and 620, a determination can be made to determine if the curve 610 or 620 is a better match. A value associated with the submodel of either the curve 610 or the curve 620 can then be determined based on the best match. The comparison of the real time data to the pattern of the curves 610 and 620 can also be used to confirm that the simplified models are adequate for expressing the details and measureable quantities of interest.

Plot 650 shows a single interferometric 724 nm time-based trend, assuming constant etch rate, for the same structure. Trend 660 may be extracted from a series of curves including curves 610 and 620 by monitoring the change in the curve only at a single wavelength, in this instance 724 nm. For this trend we can observe a strong fringe with good contrast that may be tracked by well-known "fringe-counting" methods. This tracked fringe may then be related directly to the change in the etched or unetched portion of the structure and then to the etched hole depth.

Figure 7:
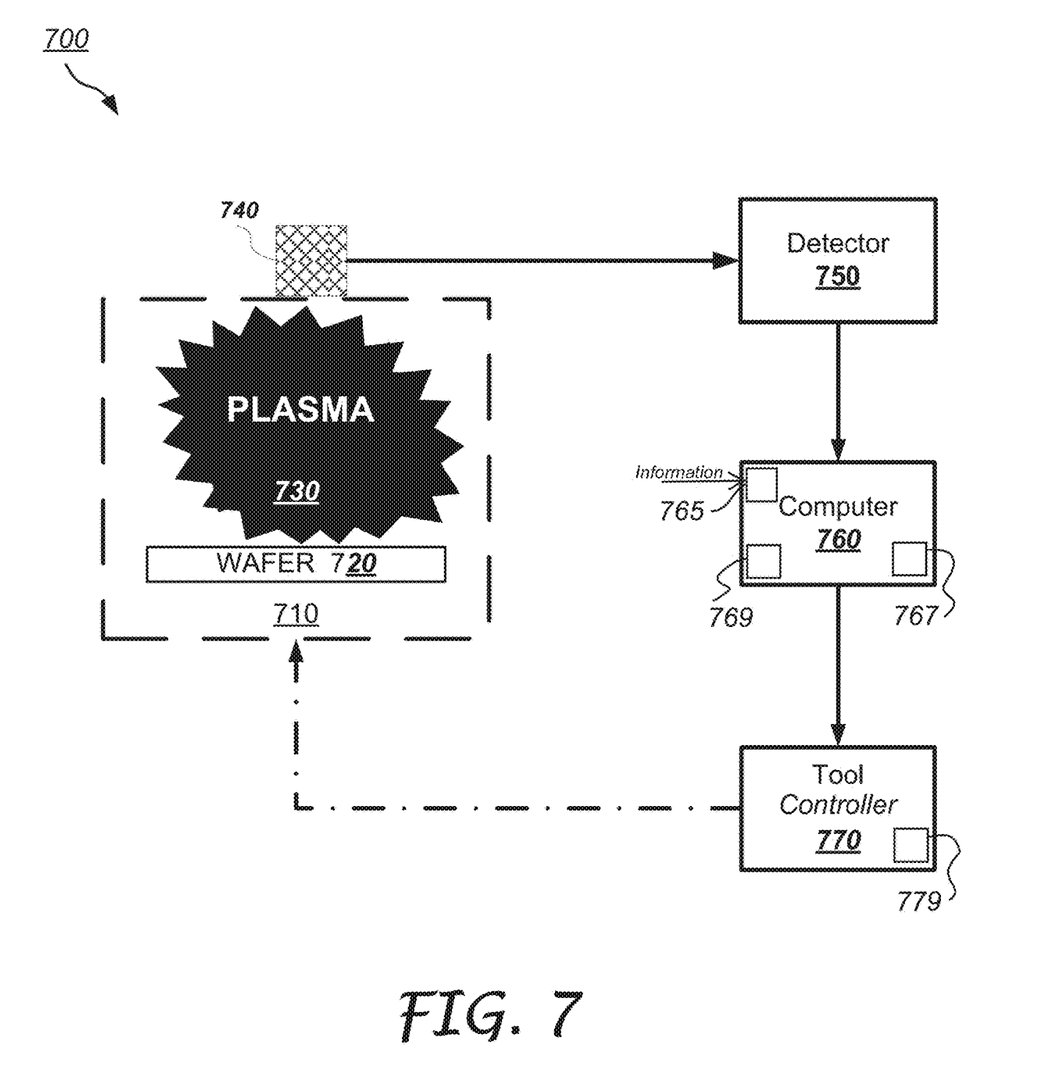
FIG. 7 illustrates a block diagram of an embodiment of a system for monitoring and/or controlling the state of a plasma etch process within a plasma reactor.

FIG. 7 illustrates a block diagram of an embodiment of a system 700 for employing optical reflectometry to monitor and/or control the state of a plasma process within a plasma reactor. The system 700 includes a plasma tool and process controller that employs the modelling scheme disclosed herein. The system 700 includes a plasma chamber/reactor 710 that is controlled by the tool controller 770. Located within the plasma chamber/reactor 710 is a wafer 720 and a process plasma 730. The process plasma 730 is used to fabricate/modify (e.g., deposit or etch) a complex structure(s), such as the 3D NAND structure 100 of FIG. 1A, on the wafer 720.

An optical system 740 sends and receives light to and from the wafer 720. Reflected light collected by the optical system 740 is guided to the optical detector 750. The optical system 740 can include a collimator and other optical elements such as, filters, lenses, windows, apertures, fiber optics, etc. The optical detector 750 can be a spectrometer.

Coupled to the optical detector 750 is a computer 760 that is configured to process the simplified reflectance models generated according to the principles disclosed herein and real-time data obtained during a manufacturing process, such as a fabrication process, via the optical system 740 and the optical detector 750. The real-time data can be optical data that is received via a conventional interface of the computer 760. The computer 760 generates processing control signals based on the processing of the models and data to direct the processing operation of the plasma chamber/reactor 710. A tool controller 770 is configured to receive the processing control signals from the computer 760 via, for example, a conventional interface and send the control signals to the plasma chamber/reactor 710 to control the fabrication process.

The computer 760 can receive information from a user interface 765 and generate the simplified reflectance models therefrom employing a processor 767 thereof. The computer 760 can compare the simplified reflectance models to already generated reflectance models and/or real-time reflectance data to determine a reflectance model to use with the monitoring data from the plasma chamber/reactor 710. The stored reflectance models may be, for example, stored in a look-up table within memory 769 of computer 760. The computer 760 can be a controller for directing the plasma process or another manufacturing process within the plasma chamber/reactor 710. In some embodiments, different processors are used to generate the simplified models and to generate the processing control signals. In one embodiment, the processor 767 generates the simplified models based on the received information and a processor 777 of the tool controller 770 generates the processing control signals based on the simplified model and optical processing data obtained from observing the semiconductor process and wafer 720 in the plasma chamber/reactor 710 during the semiconductor process. As such, the computer 760 and the tool controller 770 can cooperate to function as a controller for directing the plasma process. In other embodiments, another processor or computer different from the computer 760, or another processor of the computer 760 can be used to either generate the simplified models or the processing control signals.

The changes described above, and others, may be made in the optical measurement systems and subsystems described herein without departing from the scope hereof. For example, although certain examples are described in association with semiconductor wafer processing equipment, it may be understood that the optical measurement systems described herein may be adapted to other types of processing equipment such as roll-to-roll thin film processing, solar cell fabrication or any application where high precision optical measurement may be required. Furthermore, although certain embodiments discussed herein describe the use of a common light analyzing device, such as an imaging spectrograph; it should be understood that multiple light analyzing devices with known relative sensitivity may be utilized. Furthermore, although the term "wafer" has been used herein when describing aspects of the current disclosure; it should be understood that other types of workpieces such as quartz plates, phase shift masks, LED substrates and other non-semiconductor processing related substrates and workpieces including solid, gaseous and liquid workpieces may be used.

The embodiments described herein were selected and described in order to best explain the principles of the disclosure and the practical application, and to enable others of ordinary skill in the art to understand the disclosure for various embodiments with various modifications as are suited to the particular use contemplated. The particular embodiments described herein are in no way intended to limit the scope of the present disclosure as it may be practiced in a variety of variations and environments without departing from the scope and intent of the disclosure. Thus, the present disclosure is not intended to be limited to the embodiment shown, but is to be accorded the widest scope consistent with the principles and features described herein.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems which perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As will be appreciated by one of skill in the art, features disclosed herein, or at least some, may be embodied as a method, system, or computer program product. Accordingly, features disclosed herein may take the form of an entirely hardware embodiment, an entirely software embodiment (including firmware, resident software, micro-code, etc.) or an embodiment combining software and hardware aspects all generally referred to herein as a "circuit" or "module." Furthermore, at least some of the features disclosed herein may take the form of a computer program product on a non-transitory computer-usable storage medium having computer-usable program code embodied in the medium.

Accordingly, the above-described system, apparatus (such as a controller), and methods or at least a portion thereof may be embodied in or performed by various processors, such as digital data processors or computers, wherein the computers are programmed or store executable programs of sequences of software instructions to perform one or more of the steps of the methods. The software instructions of such programs disclosed herein may represent algorithms and be encoded in machine-executable form on non-transitory digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the methods described herein or components of the apparatuses described herein.

Certain embodiments disclosed herein can further relate to computer storage products with a non-transitory computer-readable medium that have program code thereon for performing various computer-implemented operations that embody the apparatuses, the systems or carry out the steps of the methods set forth herein. Non-transitory medium used herein refers to all computer-readable media except for transitory, propagating signals. Examples of non-transitory computer-readable medium include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include both machine code, such as produced by a compiler, and files containing higher level code that may be executed by the computer using an interpreter.

Various aspects of the disclosure can be claimed including the systems and methods as disclosed herein.

Aspects disclosed herein include:

A. A method of generating a reduced complexity model of a complex semiconductor structure for monitoring of the semiconductor structure during a semiconductor manufacturing process, comprising: receiving information about the semiconductor structure; determining, as a function of at least one variable processing parameter, a simplified optical model of both a modified portion and an unmodified portion of the semiconductor structure employing effective medium approximation and the received information; and combining the simplified optical models of the unmodified portion and the modified portion to provide a simplified model for the semiconductor structure, wherein the simplified model is sufficient for providing controls for the semiconductor manufacturing process.

B. A controller for directing a semiconductor process of a complex semiconductor structure, comprising: an interface configured to receive information corresponding to a semiconductor process and a semiconductor structure; and a processor configured to generate a simplified optical model of the semiconductor structure employing the information and effective medium approximations, and generate processing control signals to direct the semiconductor process based on the simplified optical model and optical processing data obtained from observing the semiconductor structure during the semiconductor process.

C. A method of generating a simplified model of a complex semiconductor structure for monitoring of the complex semiconductor structure during a semiconductor manufacturing process, comprising: receiving information about a complex semiconductor structure; constructing a simplified model of the complex semiconductor structure employing the information and effective medium approximation; and iteratively determining the simplified model is sufficient to provide meaningful results for monitoring a parameter of interest during the semiconductor manufacturing process.

Each of aspects A, B, and C can have one or more of the following additional elements in combination:

Element 1: wherein the received information includes film thicknesses, film types and optical characteristics, film/feature dimensions/pitches, shapes and orientation. Element 2: wherein the processing parameter includes at least one of a film thickness, film types and optical characteristics, film/feature dimensions/pitches, shapes and orientation. Element 3: wherein at least one spanning parameter is employed when determining the simplified optical models for the modified portion or the unmodified portion. Element 4: wherein the spanning parameter corresponds to a parameter of the semiconductor structure having a value that is excluded from the received information. Element 5: wherein the value is determined during the semiconductor process. Element 6: wherein the spanning parameter provides a range for variations in parameters selected from the list consisting of: geometric class, volume fraction, material properties, and parameters of the semiconductor structure insufficiently defined by the received information. Element 7: wherein the simplified model for the semiconductor structure includes a first variable processing parameter that corresponds to the unmodified portion and a second variable processing parameter that corresponds to the modified portion, wherein the first and second variable processing parameters are parameters of interest to monitor during the semiconductor process. Element 8: wherein the semiconductor process is etching and the method further includes determining a simplified optical model of a mask of the semiconductor structure employing an effective medium approximation and combining the simplified optical model of the mask with the simplified optical models of the unmodified portion and the modified portion to provide the simplified model for the semiconductor structure. Element 9: wherein the unmodified portion is an un-etched portion and a modified portion is an etched portion of the semiconductor structure. Element 10: wherein the mask is represented in the simplified optical model of the mask as a single homogeneous layer when un-etched or fully etched and as a bilayer when partially etched. Element 11: wherein the semiconductor structure is a 3D NAND structure and the semiconductor process is etching of channel holes or deposition of layers, wherein the unmodified portion is an un-etched portion and a modified portion is an etched portion of the semiconductor structure. Element 12: wherein the determining a simplified optical model of an etched portion of the semiconductor structure includes employing the simplified optical model of the un-etched portion and another material, identified by the received information, that is added to or subtracted from the un-etched portion. Element 13: wherein the determining a simplified optical model of the etched portion of the semiconductor structure includes determining when length parameters of the channel holes permit application of an effective medium approximation and when permitted, applying an effective medium approximation to approximate a stack of thin alternating layers as a homogeneous material and model the portion of the stack of layers into which the channel holes have penetrated as a second homogeneous material of lower density. Element 14: wherein the combining is performed using optical reflectometry models. Element 15: wherein the information is minimum information. Element 16: wherein a first processor is configured to generate the simplified optical model and a second processor, different than the first processor, is configured to generate the processing control signals. Element 17: wherein a first processor is configured to generate the simplified optical model and a second processor, different than the first processor, is configured to generate the processing control signals. Element 18: wherein the iteratively determining includes obtaining additional information about the complex semiconductor structure when determining the simplified model is insufficient to provide the meaningful results.

What is claimed is:

1. A method of generating a reduced complexity model of a complex semiconductor structure for monitoring of the semiconductor structure during a semiconductor manufacturing process, comprising:
    receiving information about the semiconductor structure;
    determining, as a function of at least one variable processing parameter, a simplified optical model of both a modified portion and an unmodified portion of the semiconductor structure employing effective medium approximation and the received information; and
    combining the simplified optical models of the unmodified portion and the modified portion to provide a simplified model for the semiconductor structure, wherein the simplified model is sufficient for providing controls for the semiconductor manufacturing process.

2. The method as recited in claim 1 wherein the received information includes film thicknesses, film types and optical characteristics, film/feature dimensions/pitches, shapes and orientation.

3. The method as recited in claim 1 wherein the processing parameter includes at least one of a film thickness, film types and optical characteristics, film/feature dimensions/pitches, shapes and orientation.

4. The method as recited in claim 1 wherein at least one spanning parameter is employed when determining the simplified optical models for the modified portion or the unmodified portion.

5. The method as recited in claim 4 wherein the spanning parameter corresponds to a parameter of the semiconductor structure having a value that is excluded from the received information.

6. The method as recited in claim 5 wherein the value is determined during the semiconductor process.

7. The method as recited in claim 4 wherein the spanning parameter provides a range for variations in parameters selected from the list consisting of:
    geometric class,
    volume fraction,
    material properties, and
    parameters of the semiconductor structure insufficiently defined by the received information.

8. The method as recited in claim 1 wherein the simplified model for the semiconductor structure includes a first variable processing parameter that corresponds to the unmodified portion and a second variable processing parameter that corresponds to the modified portion, wherein the first and second variable processing parameters are parameters of interest to monitor during the semiconductor process.

9. The method as recited in claim 1 wherein the semiconductor process is etching and the method further includes determining a simplified optical model of a mask of the semiconductor structure employing an effective medium approximation and combining the simplified optical model of the mask with the simplified optical models of the unmodified portion and the modified portion to provide the simplified model for the semiconductor structure.

10. The method as recited in claim 9 wherein the unmodified portion is an un-etched portion and a modified portion is an etched portion of the semiconductor structure.

11. The method as recited in claim 9 wherein the mask is represented in the simplified optical model of the mask as a single homogeneous layer when un-etched or fully etched and as a bilayer when partially etched.

12. The method as recited in claim 1 wherein the semiconductor structure is a 3D NAND structure and the semiconductor process is etching of channel holes or deposition of layers, wherein the unmodified portion is an un-etched portion and a modified portion is an etched portion of the semiconductor structure.

13. The method as recited in claim 12 wherein the determining a simplified optical model of an etched portion of the semiconductor structure includes employing the simplified optical model of the un-etched portion and another material, identified by the received information, that is added to or subtracted from the un-etched portion.

14. The method as recited in claim 12 wherein the determining a simplified optical model of the etched portion of the semiconductor structure includes determining when length parameters of the channel holes permit application of an effective medium approximation and when permitted, applying an effective medium approximation to approximate a stack of thin alternating layers as a homogeneous material and model the portion of the stack of layers into which the channel holes have penetrated as a second homogeneous material of lower density.

15. The method as recited in claim 1 wherein the combining is performed using optical reflectometry models.

16. The method as recited in claim 1 wherein the information is minimum information.

17. A controller for directing a semiconductor process of a complex semiconductor structure, comprising:
    an interface configured to receive information corresponding to a semiconductor process and a semiconductor structure; and
    a processor configured to generate a simplified optical model of both a modified portion and an unmodified portion of the semiconductor structure employing the information and effective medium approximations, and generate processing control signals to direct the semiconductor process based on the simplified optical model and optical processing data obtained from observing the semiconductor structure during the semiconductor process.

18. The controller as recited in claim 17 wherein a first processor is configured to generate the simplified optical model and a second processor, different than the first processor, is configured to generate the processing control signals.

19. A method of generating a simplified model of a complex semiconductor structure for monitoring of the complex semiconductor structure during a semiconductor manufacturing process, comprising:
   receiving information about a complex semiconductor structure;
   constructing a simplified model of the complex semiconductor structure employing the information and effective medium approximation; and
   iteratively determining the simplified model is sufficient to provide meaningful results for monitoring a parameter of interest during the semiconductor manufacturing process.

20. The method as recited in claim 19 wherein the iteratively determining includes obtaining additional information about the complex semiconductor structure when determining the simplified model is insufficient to provide the meaningful results.

* * * * *